(12) United States Patent
Wu et al.

(10) Patent No.: US 10,280,288 B2
(45) Date of Patent: May 7, 2019

(54) CALCIUM SULFATE CRYSTALS AND METHODS FOR MAKING THE SAME

(71) Applicant: Georgia-Pacific Gypsum LLC, Atlanta, GA (US)

(72) Inventors: Mianxue Wu, Suwanee, GA (US); Jeffrey T. Fields, Suwanee, GA (US)

(73) Assignee: Georgia-Pacific Gypsum LLC, Atlanta, GA (US)

( * ) Notice: Subject to any disclaimer, the term of this patent is extended or adjusted under 35 U.S.C. 154(b) by 593 days.

(21) Appl. No.: 14/561,239

(22) Filed: Dec. 5, 2014

(65) Prior Publication Data

US 2015/0158735 A1 Jun. 11, 2015

Related U.S. Application Data

(60) Provisional application No. 61/912,609, filed on Dec. 6, 2013, provisional application No. 62/074,163, filed on Nov. 3, 2014.

(51) Int. Cl.
*C08K 7/08* (2006.01)
*C30B 7/04* (2006.01)
(Continued)

(52) U.S. Cl.
CPC .............. *C08K 7/08* (2013.01); *C01F 11/466* (2013.01); *C30B 7/04* (2013.01); *C30B 7/10* (2013.01); *C30B 29/10* (2013.01); *C30B 29/46* (2013.01); *C30B 29/62* (2013.01); *C01P 2004/10* (2013.01); *C01P 2004/54* (2013.01); *C01P 2004/61* (2013.01); *C01P 2004/62* (2013.01);
(Continued)

(58) Field of Classification Search
None
See application file for complete search history.

(56) References Cited

U.S. PATENT DOCUMENTS 3,822,340 A 7/1974 Eberl et al.
3,915,927 A * 10/1975 Jaunarajs ................ C04B 11/02
524/423
(Continued)

FOREIGN PATENT DOCUMENTS

CA 2024146 A1 3/1990
CN 1598083 A 3/2005
(Continued)

OTHER PUBLICATIONS

George C. Hawley, "Calcium Sulfate Whiskers (CSW) Reinforcement of Polymers—A Review", Society of Plastics Engineers, (2012), ANTEC 2012 Plastics: Annual Technical Conference Proceedings, Online version available at: http://app.knovel.com/hotlink/pdf/id:kt00APLKH1/antec-2012-plastics-annual/calcium-sulfate-whiskers ; herein referred to as Hawley.*

(Continued)

*Primary Examiner* — Laura C Powers
(74) *Attorney, Agent, or Firm* — Eversheds Sutherland (US) LLP; Stacy Fredrich; Ram W. Sabnis (57) ABSTRACT

A composition of matter is provided, including anhydrite calcium sulfate whiskers having a mean aspect ratio of at least 30. Another composition of matter is provided, including alpha-derived anhydrite calcium sulfate whiskers. Yet another composition of matter is provided, including fine alpha particle-derived anhydrite calcium sulfate whiskers.

24 Claims, 3 Drawing Sheets

(51) Int. Cl.
*C30B 7/10* (2006.01)
*C01F 11/46* (2006.01)
*C30B 29/10* (2006.01)
*C30B 29/46* (2006.01)
*C30B 29/62* (2006.01)

(52) U.S. Cl.
CPC ...... *C01P 2006/10* (2013.01); *C01P 2006/12* (2013.01); *C01P 2006/37* (2013.01); *C01P 2006/90* (2013.01); *C08K 2201/003* (2013.01); *C08K 2201/004* (2013.01); *C08K 2201/006* (2013.01); *C08K 2201/016* (2013.01); *Y10T 428/298* (2015.01)

(56) References Cited

U.S. PATENT DOCUMENTS

| | | | |
|---|---|---|---|
| 3,961,105 | A | 6/1976 | Eberl et al. |
| 3,977,890 | A | 8/1976 | Jaunarajs et al. |
| 4,029,512 | A | 6/1977 | Jaunarajs et al. |
| 4,152,408 | A * | 5/1979 | Winslow ............. C01F 11/46 106/778 |
| 4,234,345 | A | 11/1980 | Fässle |
| 4,240,870 | A | 12/1980 | Shibazaki et al. |
| 4,664,707 | A | 5/1987 | Wilson et al. |
| 4,722,866 | A | 2/1988 | Wilson et al. |
| 4,818,287 | A | 4/1989 | Ravins et al. |
| 5,288,806 | A | 2/1994 | Peacock |
| 5,438,086 | A | 8/1995 | Stevenson et al. |
| 6,241,815 | B1 * | 6/2001 | Bonen ............. C04B 28/145 106/709 |
| 6,255,380 | B1 | 7/2001 | Oki et al. |
| 6,459,075 | B1 | 10/2002 | McCarthy et al. |
| 6,700,106 | B2 | 3/2004 | Cochran, II et al. |
| 6,803,398 | B1 | 10/2004 | Ito et al. |
| 7,273,579 | B2 | 9/2007 | Miller et al. |
| 2002/0069950 | A1 | 6/2002 | Lynn et al. |
| 2002/0164281 | A1 | 11/2002 | Sethuraman et al. |
| 2004/0131714 | A1 | 7/2004 | Burke |
| 2004/0182286 | A1 | 9/2004 | Cox et al. |
| 2005/0124753 | A1 | 6/2005 | Ashihara et al. |
| 2005/0263925 | A1 | 12/2005 | Heseltinc et al. |
| 2006/0155073 | A1 | 7/2006 | Oobayashi et al. |
| 2008/0148998 | A1 | 6/2008 | Bruce et al. |
| 2008/0152559 | A1 | 6/2008 | Bolind et al. |
| 2010/0086474 | A1 | 4/2010 | Yang et al. |
| 2011/0132560 | A1 | 6/2011 | Turkki et al. |
| 2015/0158735 | A1 | 6/2015 | Wu et al. |
| 2015/0158997 | A1 | 6/2015 | Wu et al. |
| 2015/0158998 | A1 | 6/2015 | Donaldson et al. |
| 2016/0122197 | A1 | 5/2016 | Wu et al. |

FOREIGN PATENT DOCUMENTS

| | | | |
|---|---|---|---|
| CN | 1611532 | A | 5/2005 |
| CN | 1784357 | A | 6/2006 |
| CN | 1796285 | A | 7/2006 |
| CN | 101029415 | A | 9/2007 |
| CN | 101550585 | A | 10/2009 |
| CN | 101608104 | A | 12/2009 |
| CN | 101717999 | A | 6/2010 |
| CN | 102115586 | A | 7/2011 |
| CN | 102134361 | A | 7/2011 |
| CN | 102134389 | A | 7/2011 |
| CN | 102140236 | A | 8/2011 |
| CN | 102153807 | A | 8/2011 |
| CN | 102219954 | A | 10/2011 |
| CN | 102234390 | A | 11/2011 |
| CN | 102234394 | A | 11/2011 |
| CN | 102234401 | A | 11/2011 |
| CN | 102241853 | A | 11/2011 |
| CN | 102311603 | A | 1/2012 |
| CN | 102503336 | A | 6/2012 |
| CN | 102504409 | A | 6/2012 |
| CN | 102534773 | A | 7/2012 |
| CN | 102912445 | A | 2/2013 |
| CN | 101671848 | A | 3/2013 |
| CN | 102965721 | A | 3/2013 |
| CN | 103014869 | A | 4/2013 |
| GB | 2011363 | A * | 7/1979 ............ C01F 11/466 |
| JP | 2004330215 | A | 11/2004 |

OTHER PUBLICATIONS

Translation of Research of Preparation of Calcium Sulfate Whiskers by Xiao-Hua Feng et al., Applied Chemical Industry, vol. 36, 2007, Issue 2, p. 135-136, 139; Translation provided by LinguaLinx Language Solutions, Inc. (Year: 2007).*

International Search Report and Written Opinion, PCT/US2014/068716, 12 pages, dated Mar. 31, 2015.

International Preliminary Report on Patentability, PCT/US2014/068716, 8 pages, dated Jun. 7, 2016.

Wu, Xue-dong, et al., "Study on Preparation Process and Application of Calcium Sulfate Whisker", Contemporary Chemical Industry, vol. 4, No. 1. (2012), pp. 22-24.

Second Office Action issued in Chinese Application No. 201480072828.6, dated Apr. 2, 2018 (25 pages).

Kuthadi, S. "Laboratory Scale Study of Calcium Sulfate Hydration forms". Western Kentucky Univ. (2014).

Xiao-Hua, et al., "Research of Preparation of Calcium Sulfate Whisker", Applied Chemical Industry, 2007, vol. 36, No. 2, pp. 134-135; 139.

Zheng Shuilin et al., "Handbook of Processing Techniques and Applications of Non-Metallic Mineral", Metallurgical Industry Press, May 31, 2005 (5 pages).

Yuan Zhitao et al., Research of the Preparation of Ultrafine Calcium Sulphate Whiskers Using Gypsum, Journal of China Mining, vol. 14, No. 11, Nov. 2005 (4 pages).

Search Report issued by Chinese Patent Office, dated Jun. 5, 2017 (2 pages).

Search Report issued by Chinese Patent Office, dated Oct. 16, 2018 (2 pages).

* cited by examiner

CALCIUM SULFATE CRYSTALS AND METHODS FOR MAKING THE SAME

CROSS-REFERENCE TO RELATED APPLICATIONS

This application claims priority to U.S. Provisional Applications No. 61/912,609, filed Dec. 6, 2013, and 62/074,163, filed Nov. 3, 2014, the disclosures of which are each incorporated by reference herein.

BACKGROUND

The present disclosure relates generally to the field of calcium sulfate-based products and manufacturing, and more particularly to calcium sulfate whiskers, composites, and methods for making the same.

Various fillers are known for use as reinforcement, opacification and/or additives in composites, paint, coatings, papermaking, and plastics. For example, fillers such as fiberglass, carbon black, calcium carbonate, silica, talc, kaolin, and aluminum hydroxide are currently used in these applications. However, fibrous fillers generally provide improved stiffness, strength, and thermal stability properties to composites, as compared to particulate and platelet shaped fillers.

Single crystal fibers, also known as "whiskers," have been shown to provide improved properties in composites as compared to traditional fibers. For example, whiskers may provide improved surface quality and aesthetics for composites, because they are typically finer and smoother than fibers. Whiskers may also provide improved dimensional and thermal stability, increased strength and toughness, and higher fluidity (e.g., for improved mold casting). However, whiskers are difficult to economically manufacture, due to the slow growth rate of whiskers. Moreover, traditional whiskers may display undesirable defects/flaws and whisker geometry, as well as limited strength and robustness.

Accordingly, there is a need for improved whiskers and composites made therewith, as well as for methods for manufacture of the same.

SUMMARY

In one aspect, a composition of matter is provided that includes alpha-derived anhydrite calcium sulfate whiskers.

In another aspect, a composition of matter is provided that includes anhydrite calcium sulfate whiskers having a mean aspect ratio of at least 30.

In yet another aspect, a composition of matter is provided that includes fine alpha particle-derived anhydrite calcium sulfate whiskers.

BRIEF DESCRIPTION OF THE DRAWINGS

Referring now to the drawings, which are meant to be exemplary and not limiting, and wherein like elements are numbered alike.

DETAILED DESCRIPTION

Disclosed herein are calcium sulfate-based whiskers and composites and methods for their use and manufacturing. These whiskers, composites, and methods meet one or more of the above-described needs by providing single crystal fibers and composites made therewith, having improved properties. For example, the whiskers may have an improved aspect ratio compared to known fibers and/or a faster growth rate.

Whiskers and Methods of Making Whiskers

In certain embodiments, whiskers are provided. As used herein, the term "whiskers" refers to single crystal fibers. Generally, the whiskers disclosed herein are made using calcium sulfate, which may also be referred to as gypsum or plaster. Calcium sulfate may exist as a hemihydrate ($CaSO_4 * \frac{1}{2}H_2O$), a dihydrate ($CaSO_4 * 2H_2O$), or an anhydrite ($CaSO_4$). Generally, the beta calcium sulfate hemihydrate, which is obtained from the calcination of dihydrate calcium sulfate under an elevated temperature at ambient pressure, may be used to prepare calcium sulfate whiskers. However, it has been discovered that alpha calcium sulfate hemihydrate provides surprising advantages to whisker processing and properties. Alpha calcium sulfate hemihydrate, which has the same chemical composition as the beta form, has gone through a pressurized calcination process, which produces well-crystallized, prismatic particles. For example, the pressurized calcination process may be an autoclave process. It should be understood that while the present disclosure generally relates to alpha calcium sulfate whiskers, the use of other suitable materials is also envisioned and intended to fall within the scope of this disclosure. For example, other materials such as beta hemihydrate calcium sulfate, dihydrate calcium sulfate, synthetically made gypsum, or separate calcium and sulfate species may be used. Additionally, under certain processing conditions, beta calcium sulfate may be used to derive whiskers having the improved geometry and other properties described herein.

In certain embodiments, methods of making anhydrite calcium sulfate whiskers include: (i) combining calcium sulfate hemihydrate and water to form a slurry; (ii) autoclaving the slurry to form calcium sulfate hemihydrate whiskers in water; (iii) dewatering the calcium sulfate hemihydrate whiskers; and (iv) heating the calcium sulfate hemihydrate whiskers to form anhydrite calcium sulfate whiskers. In embodiments, the calcium sulfate hemihydrate is alpha calcium sulfate hemihydrate.

In one embodiment, the step of combining the calcium sulfate hemihydrate and water includes combining the calcium sulfate hemihydrate with the water such that the calcium sulfate is present in the slurry in an amount from about 1 to about 30 percent by weight of the slurry. For example, the calcium sulfate hemihydrate may be combined with the water such that the calcium sulfate is present in the slurry in an amount from about 2 to about 25 percent by weight of the slurry, or from about 5 to about 15 percent by weight of the slurry. In one embodiment, the calcium sulfate hemihydrate may be combined with the water such that the calcium sulfate is present in the slurry in an amount from about 5 to about 20 percent by weight of the slurry. Without being bound by a particular theory, it is believed that the combination of calcium sulfate hemihydrate and water results in dihydrate crystals in the slurry.

In certain embodiments, the calcium sulfate hemihydrate has a median particle size from about 1 µm to about 100 µm, such as from about 1 µm to about 20 µm. For example, the calcium sulfate hemihydrate may have a median particle size from about 1 μm to about 10 μm, or from about 2 to about 5 μm.

In certain embodiments, the calcium sulfate hemihydrate has a fine or finer size. As used herein, the terms "fine" and "finer" refer to particles having a median particle size smaller than that of commercially obtained particles. In certain embodiments, fine calcium sulfate hemihydrate particles also have a narrow particle size distribution as compared to that of commercially obtained particles. For example, fine calcium sulfate hemihydrate particles may have a narrow particle size distribution in which the $90^{th}$ percentile of particles, by size, has a size that is no more than 150% more than the $50^{th}$ percentile of particles. For example, fine calcium sulfate hemihydrate particles may have a narrow particle size distribution in which the $100^{th}$ percentile of particles, by size, has a size that is no more than 500% more than the $50^{th}$ percentile of particles. For example, fine calcium sulfate hemihydrate particles may have a narrow particle size distribution in which the $100^{th}$ percentile of particles, by size, has a size that is no more than 2000% more than the $10^{th}$ percentile of particles. That is, the fine particles may have a more uniform size distribution, in addition to a smaller median particle size, as compared to commercially obtained particles.

As discussed in further detail below, it was surprisingly found that whiskers made from a starting material of fine calcium sulfate hemihydrate display improved properties such as increased aspect ratio and surface smoothness.

In certain embodiments, methods of making anhydrite calcium sulfate whiskers further include sizing the calcium sulfate hemihydrate to form fine calcium sulfate hemihydrate having a median particle size from about 1 μm to about 10 μm, prior to combining the alpha calcium sulfate hemihydrate and water to form a slurry. For example, the fine calcium sulfate hemihydrate may be sized to have a median particle size from about 1 to about 5 μm. In certain embodiments, the particles are sized after the slurry has been formed.

For example, the calcium sulfate hemihydrate may be sized by jet mill, pulverization, comminution, separation, micronization, grinding, or other suitable sizing or fining processes known to those of ordinary skill in the art.

In certain embodiments, the slurry is autoclaved to form calcium sulfate hemihydrate whiskers in water. In one embodiment, the step of autoclaving the slurry includes subjecting the slurry to saturated steam at a pressure from about 0 psig to about 50 psig and a temperature from about 100° C. to about 150° C. for a duration from about 30 minutes to about 8 hours. For example, the step of autoclaving the slurry may include subjecting the slurry to saturated steam at a pressure from about 1 psig to about 30 psig and a temperature from about 101° C. to about 134° C. for a duration from about 30 minutes to about 8 hours. For example, such autoclave parameters may be applied in a small-scale production setting, such as in the lab. For example, the step of autoclaving the slurry may include subjecting the slurry to saturated steam at a pressure from about 30 psig to about 52 psig and a temperature from about 134° C. to about 150° C. for a duration from about 30 minutes to about 8 hours. For example, such autoclave parameters may be applied in an industrial-scale production setting. Without being bound by a particular theory, it is believed that the calcium sulfate dihydrate crystals dissolve during the heating process and reform as hemihydrate whiskers at the high temperature.

The calcium sulfate hemihydrate whiskers may then be dewatered, i.e., the whiskers may be separated from water. In certain embodiments, the step of dewatering the calcium sulfate hemihydrate whiskers includes filtering, vacuuming, centrifuging, or a combination thereof. For example, a screen filter may be used to dewater the whiskers. In one embodiment, the step of dewatering the calcium sulfate hemihydrate whiskers includes filtering the alpha calcium sulfate hemihydrate whiskers.

The calcium sulfate hemihydrate whiskers may then be heated, or "dead burned," to achieve a stable, insoluble anhydrite form. In certain embodiments, the step of heating the calcium sulfate hemihydrate whiskers to form anhydrite calcium sulfate whiskers includes heating the calcium sulfate hemihydrate whiskers at a temperature from about 500° C. to about 900° C. for a duration from about 20 minutes to about 24 hours.

Compositions of anhydrite calcium sulfate whiskers are also provided herein. For example, these whiskers may be produced by the methods disclosed herein. For example, these whiskers may be the product formed by the heating step described above.

In certain embodiments, compositions include alpha-derived anhydrite calcium sulfate whiskers. As used herein, the term "alpha-derived" refers to whiskers derived from alpha calcium sulfate hemihydrate. In certain embodiments, compositions include anhydrite calcium sulfate whiskers having a mean aspect ratio of at least 30. In certain embodiments, compositions include fine alpha particle-derived anhydrite calcium sulfate whiskers. As used herein, the term "mean" in relation to dimensions or other properties of the whiskers, refers to the average dimension or property measurement of a sample of the whiskers.

In one embodiment, the anhydrite calcium sulfate whiskers have a mean aspect ratio of at least 30. As used herein, the term "aspect ratio" refers to the ratio of the length of a calcium sulfate whisker to its diameter, or the ratio of the average whisker length to the average whisker diameter for a sample of whiskers. In certain embodiments, the anhydrite calcium sulfate whiskers have a mean aspect ratio from about 30 to about 140. For example, the anhydrite calcium sulfate whiskers may have a mean aspect ratio from about 40 to about 115.

In certain embodiments, the anhydrite calcium sulfate whiskers have a mean diameter from about 0.3 μm to about 1.5 μm. In one embodiment, the anhydrite calcium sulfate whiskers have a mean diameter from about 0.4 μm to about 1.4 μm. In certain embodiments, the anhydrite calcium sulfate whiskers have a mean length from about 20 μm to about 100 μm. In one embodiment, the anhydrite calcium sulfate whiskers have a mean length from about 40 μm to about 80 μm.

In one embodiment, the anhydrite calcium sulfate whiskers have a mean length from about 60 μm to about 75 μm, a mean diameter from about 1.0 μm to about 1.5 μm, and a mean aspect ratio from about 40 to about 75.

The anhydrite calcium sulfate whiskers may display one or more strength, hardness, or stability properties, as described herein. In certain embodiments, the anhydrite calcium sulfate whiskers have a Mohs hardness from about 3 to about 3.5. In certain embodiments, the anhydrite calcium sulfate whiskers are thermally stable up to at least 1400° C. As used herein, the term "thermally stable" refers to the whiskers being resistant to decomposition at a given temperature.

As compared to beta-derived whiskers, the alpha-derived whiskers described herein may have improved hardness and smoothness properties. As used herein, the term "beta-derived" refers to whiskers made from beta calcium sulfate. In certain embodiments, alpha-derived anhydrite calcium sulfate whiskers have a mean true density of greater than 2.91 g/cm³, which is generally higher than the density of beta-derived whiskers.

True density (also referred to as skeletal or skeleton density) is a fundamental property of materials, which may be used to infer intrinsic properties, such as hardness, modulus, or strength, of materials. For example, when intrinsic properties such as hardness, modulus, or strength are difficult or impossible to measure directly (such as in the case of micron-scale whiskers), a difference in the true density between two materials having the same chemistry or raw material source can be correlated with a difference in these intrinsic properties. As compared to beta-derived whiskers, the alpha-derived whiskers described herein may display a higher true density, which may result in improved reinforcing properties of the whiskers.

In certain embodiments, the whiskers have a mean true density greater than 2.91 g/cm³. For example, the whiskers may have a mean true density of about 2.913 g/cm³ or higher. In one embodiment, the whiskers have a mean true density from about 2.913 g/cm³ to about 2.918 g/cm³. For example, the whiskers may have a mean true density of about 2.92 g/cm³. In contrast, beta-derived whiskers may display a mean true density of 2.91 g/cm³ and lower.

Specific surface area (for example as measured by the Brunauer-Emmett-Teller, or BET, method) is a material property that characterizes the surface smoothness and perfection of crystals like whiskers. A high surface area (where other properties are equal) tends to indicate a higher unevenness, roughness, and other higher degrees of surface defects of whisker-like materials. As compared to beta-derived whiskers, the alpha-derived whiskers described herein may display a lower specific surface area, and therefore increased surface smoothness and decreased defects, which may result in improved reinforcing properties of the whiskers.

In certain embodiments, the whiskers have a mean specific surface area less than 3.5 m²/g. For example, the whiskers may have a mean specific surface area of about 3.0 m²/g or lower. In one embodiment, the whiskers have a mean specific surface area from about 2.283 m²/g to about 2.304 m²/g. For example, the whiskers may have a mean specific surface area of about 2.3 m²/g. In contrast, beta-derived whiskers may display a mean specific surface area of 3.5 m²/g and higher.

In certain embodiments, the anhydrite calcium sulfate whiskers are alpha-derived and have a crystal growth rate of at least 3 times that of beta-derived calcium sulfate whiskers. As used herein, the term "crystal growth rate" refers to the speed of formation of the whiskers from the calcium sulfate particles. Moreover, alpha-derived whiskers are generally observed to be smoother and to have fewer flaws than beta-derived whiskers. These properties equate to more robust whiskers having dimensions suitable for reinforcement or structural applications, as described in more details in the Examples.

In certain embodiments, particularly those in which fine calcium sulfate hemihydrate is used as the starting material, the anhydrite calcium sulfate whiskers have a mean aspect ratio of at least 50. That is, the fine particle-derived whiskers may have an increased aspect ratio relative to other particle-derived whiskers. In one embodiment, the whiskers have a mean aspect ratio mean aspect ratio from about 55 to about 140.

In certain embodiments, the anhydrite calcium sulfate whiskers have a mean diameter from about 0.4 µm to about 1.0 µm. In one embodiment, the anhydrite calcium sulfate whiskers have a mean diameter from about 0.4 µm to about 0.8 µm. In certain embodiments, the anhydrite calcium sulfate whiskers have a mean length from about 40 µm to about 80 µm. In one embodiment, the anhydrite calcium sulfate whiskers have a mean length from about 45 µm to about 55 µm.

In one embodiment, fine particle-derived anhydrite calcium sulfate whiskers have a mean length from about 45 µm to about 55 µm, a mean diameter from about 0.4 µm to about 0.8 µm, and a mean aspect ratio from about 55 to about 140.

Composites and Methods of Making

In certain embodiments, composites including whiskers are also provided. For example, the whiskers described herein may be lightweight and have desirable properties for structural reinforcement, and thermal and acoustic insulation. For example, the whiskers may provide improved dimensional and thermal stability, increased strength and toughness, and higher fluidity (e.g., for improved mold casting). Moreover, the whiskers may provide improved surface quality and aesthetics for composites, because they are typically finer and smoother than fibers.

In certain embodiments, methods of making composites include combining alpha-derived, fine particle-derived, and/or other anhydrite calcium sulfate whiskers with a base material to form a composite. In certain embodiments, composites include alpha-derived anhydrite calcium sulfate whiskers and a base material.

For example, the base material may include composites, elastomers, thermosets, paints, coatings, paper, paper precursors, plastics, resins, and combinations thereof. Generally, alpha-derived anhydrite calcium sulfate whiskers may be used in any applications where traditional fillers, opacification agents, or reinforcing additives, such as but not limited to fiberglass, carbon black, calcium carbonate, silica, talc, kaolin, or aluminum hydroxide, are currently used. For example, alpha-derived anhydrite calcium sulfate whiskers may be combined with paper materials, plastics, including elastomers, thermoplastics, and thermosets, and/or resins, including epoxies, phenolics, and thermoset resins. In certain embodiments, the base material is polyethylene, polybutylene, polypropylene, nylon 6, nylon 66, polyurethane, epoxy, nitrile rubber, butyl rubber, silicone rubber, or PTFE.

In one embodiment, the step of combining the anhydrite calcium sulfate whiskers and the base material includes combining the anhydrite calcium sulfate whiskers with the base material such that the anhydrite calcium sulfate whiskers are present in the composite in an amount from about 1 to about 50 percent by weight of the composite, such as from about 3 to about 40 percent by weight of the composite, or from about 4 to about 25 percent by weight of the composite. In one embodiment, a composite includes from about 3 to about 10 percent by weight anhydrite calcium sulfate whiskers.

In one embodiment of a composite, the base material includes polypropylene, the composite includes from about 2 to about 20 percent by weight alpha-derived anhydrite calcium sulfate whiskers, such as from about 4 to about 10 percent by weight alpha-derived anhydrite calcium sulfate whiskers, and the composite has an elastic modulus of at least 1000 MPa.

EXAMPLES

Embodiments of the calcium sulfate whiskers and composites disclosed herein were manufactured and tested. The results are shown below and at FIGS. 1-3.

Example 1

Calcium sulfate whiskers were prepared using alpha and beta hemihydrate particles mined from the same source, according to the following method. Calcium sulfate hemihydrate was combined with water to form a slurry containing 5 weight percent calcium sulfate. The slurry was autoclaved at a pressure of 10 psig and a temperature of 115° C. for 2 hours to form whiskers. The resulting whiskers were dewatered by screen filtering for 5 minutes. The dewatered whiskers were heated at a temperature of 600° C. for 3 hours to form stable, insoluble calcium sulfate anhydrite whiskers. The resulting alpha and beta calcium sulfate anhydrite whiskers were then photographed.

Figure 1:
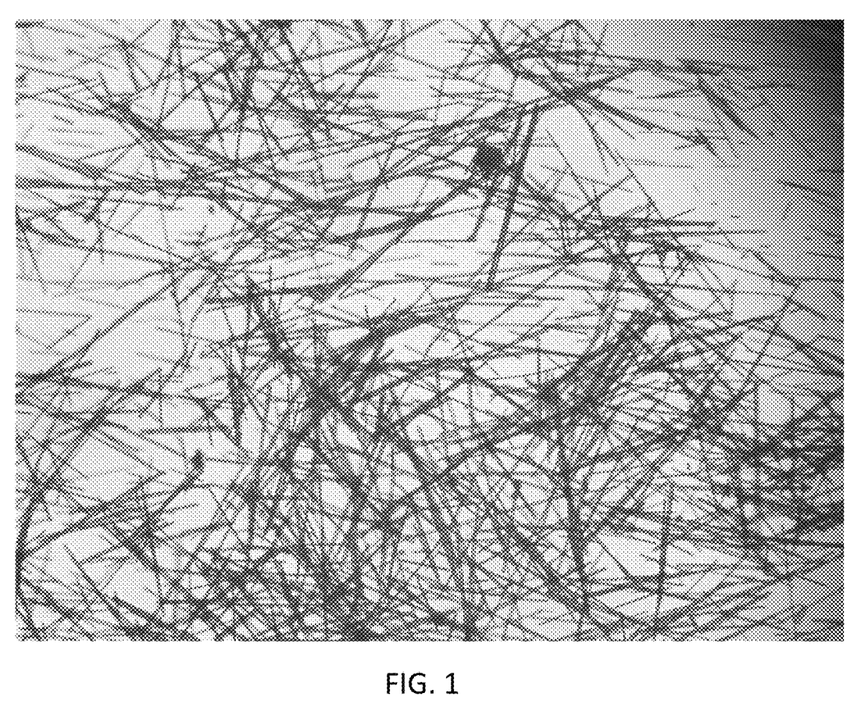
FIG. 1 is a micrograph showing alpha-derived anhydrite calcium sulfate whiskers prepared in accordance with one embodiment of the methods disclosed herein.
Figure 2:
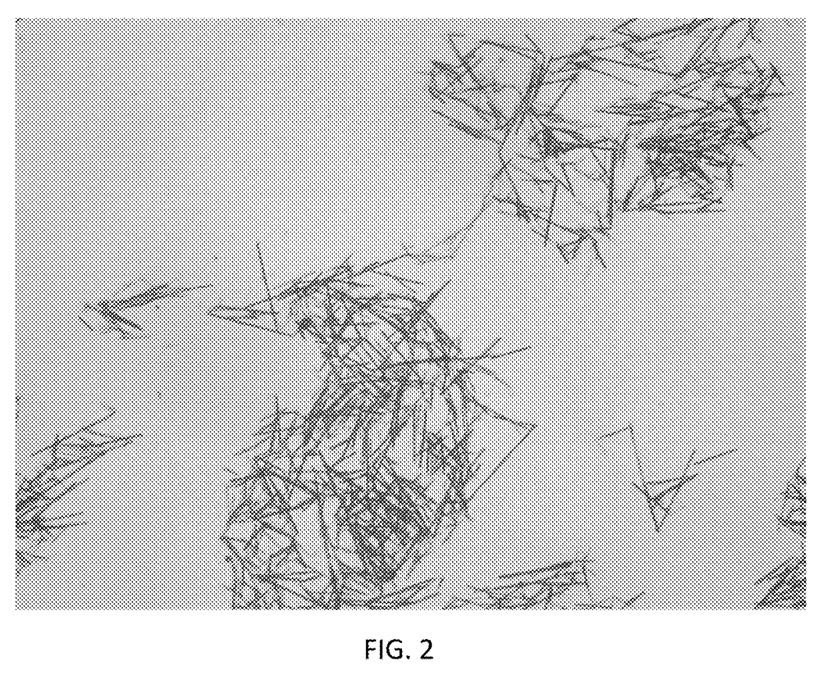
FIG. 2 is a micrograph showing beta-derived anhydrite calcium sulfate whiskers.

FIG. 1 is a micrograph (600×400 microns) taken by optical microscopy showing the alpha-derived anhydrite calcium sulfate whiskers prepared according to the above method. FIG. 2 is a micrograph (600×400 microns) taken by optical microscopy showing the beta-derived anhydrite calcium sulfate whiskers prepared by the same method as the alpha whiskers. These micrographs show the distinct morphology (e.g., length, diameter) of the alpha versus beta whiskers. For example, the alpha whiskers are much longer than the beta whiskers, and have a greater aspect ratio than the beta whiskers. Furthermore, the micrographs reveal that the growth rate is much faster for alpha whiskers than beta whiskers.

Specifically, it has been determined that the alpha calcium sulfate has a crystal growth rate of at least 3-5 times that of beta calcium sulfate. Thus, the autoclave time needed to make whiskers of identical length is much shorter with the alpha calcium sulfate, reducing the necessary processing time. This is significant because the low growth rate of beta calcium sulfate whiskers led to high costs for manufacturing, making the practical applications of calcium sulfate whiskers cost-prohibitive. Without being bound by a particular theory, it is believe that due to its "pre-autoclaved" nature, alpha calcium sulfate is able to more quickly grow into elongated whiskers under the autoclave environment. However, whiskers having a similar geometry to alpha-derived whiskers, but made using other starting materials, are also intended to come within the scope of this disclosure.

Example 2

Alpha and beta calcium sulfate whiskers were prepared in accordance with the method of Example 1. The whiskers were combined with polypropylene to form composites and the stiffness/flexural modulus of each composite was measured according to the Chord method and compared against the stiffness/flexural modulus of the polypropylene alone. The results are shown below in Table 1.

The whiskers were either premixed or side fed with the polypropylene. Premixed refers to the whiskers being combined with extruded polypropylene pellets prior to melting to form a composite. Side fed refers to the whiskers being fed into the extruder when the polypropylene is already molten.

TABLE 1

Stiffness/Flexural Modulus of Whisker-Reinforced Polypropylene Composites

| Sample | Flexural Modulus of Whisker-Reinforced Polypropylene (MPa) | Flexural Modulus of Polypropylene (MPa) | Increased Stiffness (%) |
| --- | --- | --- | --- |
| Beta-derived whiskers: 10 wt. % premixed | 813 | 863 | −5.8 |
| Beta-derived whiskers: 10 wt. % premixed | 1106 | 1085 | 1.9 |
| Alpha-derived whiskers: 10.1 wt. % premixed | 1060 | 754 | 40.6% |
| Alpha-derived whiskers: 4.39 wt. % side fed | 1240 | 754 | 64.5% |
| Alpha-derived whiskers: 9.25 wt. % side fed | 1630 | 834 | 95.4% |
| Alpha-derived whiskers: 9.49 wt. % side fed | 1886 | 849 | 122.1% |

These results show that polypropylene composites with alpha whisker reinforcement display much better mechanical properties than composites with comparable beta whisker reinforcement. Without being bound by a particular theory, it is believed that the premixed process causes the whiskers to be ground up by the unmelted polypropylene pellets, which may result in a lessened reinforcing effect of the whiskers. However, the premixed alpha whiskers performed surprisingly well, showing a 40% increase in stiffness, as compared to the premixed beta whiskers, which showed negligible stiffness increases.

Figure 3:
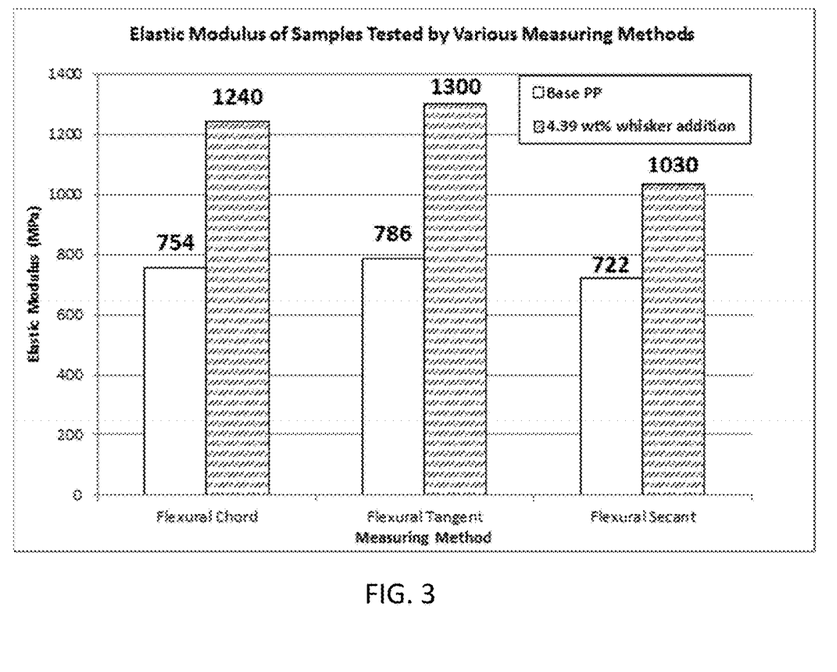
FIG. 3 is a graph showing the elastic modulus of composite samples prepared in accordance with one embodiment of the methods disclosed herein, as tested according to three measuring methods.

FIG. 3 shows the elastic modulus of polypropylene versus a composite of polypropylene and 4.39 wt. % alpha calcium sulfate whiskers, measured according to the Flexural Chord, Flexural Tangent, and Flexural Secant methods. As shown, the stiffness of the polypropylene composite increases significantly (up to 65%) with the addition of the alpha whiskers.

Example 3

The commercially obtained alpha calcium sulfate particles used in the foregoing examples had a median particle size of 15.4 µm and a maximum particle size of 120 µm. Finer alpha calcium sulfate particles having a narrow distribution were also prepared and tested. Specifically, commercially obtained alpha calcium sulfate particles were ground in a jet mill to a median particle size of 3.06 µm and a maximum particle size of about 12 µm. Thus, the finer particles were smaller and more uniform in size than the commercially obtained calcium sulfate particles, as shown in Table 2.

TABLE 2

Fine Alpha Calcium Sulfate Particle Dimension Distributions

| Time | $D_{10}$ Particle Size: $10^{th}$ Percentile (μm) | $D_{50}$ Particle Size: $50^{th}$ Percentile (μm) | $D_{90}$ Particle Size: $90^{th}$ Percentile (μm) | $D_{100}$ Particle Size: $100^{th}$ Percentile (μm) |
|---|---|---|---|---|
| Before Sizing | 2.55 | 15.72 | 52.83 | 120.22 |
| After Sizing | 1.13 | 3.06 | 6.42 | 12.00 |

The particles were jet milled on a fluid energy mill employing compressed air to produce the smaller particles. High-speed rotation within the mill subjects the calcium sulfate particles to particle-on-particle impact. The size of the particles was measured using a laser diffraction particle size analyzer (LA-950, commercially available from HORIBA of Kyoto, Japan). As shown in Table 2, the finer particles displayed a maximum size 10 times smaller than the commercially obtained particles. Also, the finer particles had a maximum particle size less than 4 times the average particle size.

Calcium sulfate whiskers were prepared by the method of Example 1, using the fine alpha particles. Whiskers were also prepared using the commercially obtained alpha particles and the fine alpha particles, but at a lower concentration of 2.5 wt. % in the slurry. Comparative samples of alpha whiskers made using commercially obtained calcium sulfate were made at a concentration of 5 wt. % in the slurry. The average length and diameter was measured by scanning electron microscopy for the resulting whiskers, and the aspect ratio was calculated. The results are shown in Table 3.

TABLE 3

Length, Diameter, and Aspect Ratio for Various Whisker Samples

| Sample | Average Length (μm) | Average Diameter (μm) | Aspect Ratio (L/D) |
|---|---|---|---|
| Low Concentration Alpha Whiskers | 71.1 | 1.27 | 56.1 |
| Standard Alpha Whiskers (Example 1) | 64.4 | 1.36 | 47.5 |
| Fine Particle-Derived Alpha Whiskers | 48.8 | 0.75 | 64.9 |
| Fine Particle-Derived Alpha and Low Concentration Whiskers | 52.6 | 0.48 | 109 |

As shown in Table 3, the fine particle-derived alpha whiskers surprisingly had a significantly higher aspect ratio than the standard alpha whiskers (almost 40% greater), with a slightly shorter length and a smaller diameter. The low concentration commercial particle-derived whiskers also showed a slightly higher aspect ratio than the standard whiskers, while the low concentration fine particle-derived whiskers showed a significantly higher aspect ratio than all other samples. Generally, an aspect ratio above 30 is desirable for reinforcement applications, with higher aspect ratios providing better structural reinforcement. Also, finer whiskers tend not to settle in the dispersion after autoclaving, such that they can avoid the crowdedness that often results in localized excessively high concentration of crystals and thus short whiskers. However, sizing the calcium sulfate adds processing time and cost to the whisker manufacturing process. Overall, these examples show that alpha calcium sulfate whiskers can be manufactured to have application-specific dimensions.

Example 4

The true density of alpha and beta-derived calcium sulfate whiskers prepared by the method of Example 1, was determined according to the method of ISO 12154, entitled "Determination of density by volumetric displacement—Skeleton density by gas pycnometry" on an instrument of gas pycnometer, Accupyc II 1340 (from Micromeritics, Norcross, Ga.). This method uses a gas (helium) displacement technique to determine the volume of the sample. The gas pycnometer measured the volume of the sample, excluding interstitial voids in bulk whiskers and any open porosity in the individual whiskers, to which the gas has access. Internal (i.e., closed) porosity, if any, would be included in the volume. The density of the whiskers was then calculated using the sample weight as measured on a high-resolution balance.

The true density values of the samples are shown in Table 4.

TABLE 4

True Density of Alpha and Beta-Derived Whiskers

| Sample | Mean True Density Value (g/cm³) | Standard Deviation (g/cm³) |
|---|---|---|
| Alpha-derived whiskers | 2.9168 | 0.0016 |
| Beta-derived whiskers | 2.9094 | 0.0023 |

Based on a statistical analysis (t-test) of the individual measurements (a total of 20 measurements), these results demonstrate that at a confidence interval of at least 95%, the alpha-derived whiskers have a higher true density than that of the beta-derived ones. A higher true density can be correlated with improved intrinsic properties, such as increased hardness, modulus, and strength values. As such, alpha-derived whisker-reinforced composites (e.g., plastic or other matrix material composites) will display improved performance properties as compared to composites reinforced with beta-derived whiskers.

Example 5

The surface area of alpha and beta-derived was determined per ISO 9277, entitled "Determination of the specific surface area of solids by gas adsorption—BET method," on a surface characterization analyzer Tristar II Plus 3030 (from Micromeritics, Norcross, Ga.). The whisker samples were prepared by heating while simultaneously evacuating or flowing gas over the samples to remove the liberated impurities. The prepared samples were then cooled with liquid nitrogen and analyzed by measuring the volume of gas (in this case $N_2$) adsorbed at specific pressures. Based on gas volume change at various pressures, the specific surface area (per the BET method) was calculated for each whisker sample.

The BET surface area values for the samples are shown in Table 5.

TABLE 5

BET Surface Area Values

| Sample | Mean Specific Surface Area Value (m²/gram) | Standard Deviation (m²/gram) |
| --- | --- | --- |
| Alpha-derived whiskers | 2.2934 | 0.0108 |
| Beta-derived whiskers | 3.5396 | 0.0233 |

These results show that the alpha-derived whiskers have a much lower surface area than that of the beta-derived ones, indicating a more perfect crystal surface. Once again, the alpha-derived whiskers appear to have grown more perfectly and display improved surface characteristics as compared to beta-derived whiskers.

Embodiments of the present disclosure further include any one or more of the following paragraphs:

1. A composition of matter, comprising alpha-derived anhydrite calcium sulfate whiskers.
2. The composition of paragraph 1, wherein the whiskers have a mean aspect ratio of at least 30.
3. The composition of paragraph 1, wherein the whiskers have a mean aspect ratio from about 30 to about 140.
4. The composition of paragraph 1, wherein the whiskers have a mean aspect ratio from about 40 to about 115.
5. The composition of paragraphs 1 to 4, wherein the whiskers have a mean diameter from about 0.3 μm to about 1.5 μm.
6. The composition of paragraphs 1 to 4, wherein the whiskers have a mean diameter from about 0.4 μm to about 1.4 μm.
7. The composition of paragraphs 1 to 6, wherein the whiskers have a mean length from about 20 μm to about 100 μm.
8. The composition of paragraphs 1 to 6, wherein the whiskers have a mean length from about 40 μm to about 80 μm.
9. The composition of paragraph 1, wherein the whiskers have a mean length from about 60 μm to about 75 μm, a mean diameter from about 1.0 μm to about 1.5 m, and a mean aspect ratio from about 40 to about 75.
10. The composition of paragraph 1, wherein the whiskers comprise fine alpha particle-derived anhydrite calcium sulfate whiskers.
11. The composition of paragraph 10, wherein the whiskers have a mean length from about 45 μm to about 55 μm, a mean diameter from about 0.4 μm to about 0.8 m, and a mean aspect ratio from about 55 to about 140.
12. The composition of paragraphs 1 to 11, wherein the whiskers have a Mohs hardness from about 3 to about 3.5.
13. The composition of paragraphs 1 to 12, wherein the whiskers are thermally stable up to at least 1400° C.
14. The composition of paragraphs 1 to 13, wherein the whiskers have a mean true density of greater than 2.91 g/cm³.
15. The composition of paragraphs 1 to 13, wherein the whiskers have a mean true density from about 2.913 g/cm³ to about 2.918 g/cm³.
16. The composition of paragraphs 1 to 15, wherein the whiskers have a crystal growth rate of at least 3 times that of beta-derived calcium sulfate whiskers.
17. The composition of paragraphs 1 to 16, wherein the whiskers have a mean specific surface area less than 3.5 m²/g.
18. The composition of paragraphs 1 to 16, wherein the whiskers have a mean specific surface area from about 2.283 m²/g to about 2.304 m²/g.
19. A composition of matter, comprising anhydrite calcium sulfate whiskers having a mean aspect ratio of at least 30.
20. The composition of paragraph 19, wherein the whiskers have a mean aspect ratio from 30 to about 140.
21. The composition of paragraph 19, wherein the whiskers have a mean aspect ratio from about 40 to about 115.
22. The composition of paragraphs 19 to 21, wherein the whiskers have a mean diameter from about 0.3 μm to about 1.5 μm.
23. The composition of paragraphs 19 to 21, wherein the whiskers have a mean diameter from about 0.4 μm to about 1.4 μm.
24. The composition of paragraphs 19 to 23, wherein the whiskers have a mean length from about 20 μm to about 100 μm.
25. The composition of paragraphs 19 to 23, wherein the whiskers have a mean length from about 40 μm to about 80 μm.
26. The composition of paragraph 19, wherein the whiskers have a mean length from about 60 μm to about 75 μm, a mean diameter from about 1.0 μm to about 1.5 μm, and a mean aspect ratio from about 40 to about 75.
27. The composition of paragraph 19, wherein the whiskers comprise fine alpha particle-derived anhydrite calcium sulfate whiskers.
28. The composition of paragraph 27, wherein the whiskers have a mean length from about 45 μm to about 55 μm, a mean diameter from about 0.4 μm to about 0.8 μm, and a mean aspect ratio from about 55 to about 140.
29. The composition of paragraphs 19 to 28, wherein the whiskers have a Mohs hardness from about 3 to about 3.5.
30. The composition of paragraphs 19 to 29, wherein the whiskers are thermally stable up to at least 1400° C.
31. The composition of paragraphs 19 to 30, wherein the whiskers have a mean true density of greater than 2.91 g/cm³.
32. The composition of paragraphs 19 to 30, wherein the whiskers have a mean true density from about 2.913 g/cm³ to about 2.918 g/cm³.
33. The composition of paragraphs 19 to 32, wherein the whiskers have a mean specific surface area less than 3.5 m²/g.
34. The composition of paragraphs 19 to 32, wherein the whiskers have a mean specific surface area from about 2.283 m²/g to about 2.304 m²/g.
35. A composition of matter, comprising fine alpha particle-derived anhydrite calcium sulfate whiskers.
36. The composition of paragraph 35, wherein the whiskers have a mean aspect ratio of at least 50.
37. The composition of paragraph 35, wherein the whiskers have a mean aspect ratio mean aspect ratio from about 55 to about 140.
38. The composition of paragraphs 35 to 37, wherein the whiskers have a mean diameter from about 0.4 μm to about 1.0 μm.
39. The composition of paragraphs 35 to 37, wherein the whiskers have a mean diameter from about 0.4 μm to about 0.8 μm.

40. The composition of paragraphs 35 to 39, wherein the whiskers have a mean length from about 40 μm to about 80 μm.
41. The composition of paragraphs 35 to 29, wherein the whiskers have a mean length from about 45 μm to about 55 μm.
42. The composition of paragraphs 35 to 41, wherein the whiskers have a Mohs hardness from about 3 to about 3.5.
43. The composition of paragraphs 35 to 442, wherein the whiskers are thermally stable up to at least 1400° C.
44. The composition of paragraphs 35 to 43, wherein the whiskers have a mean true density of greater than 2.91 g/cm$^3$.
45. The composition of paragraphs 35 to 43, wherein the whiskers have a mean true density from about 2.913 g/cm$^3$ to about 2.918 g/cm$^3$.
46. The composition of paragraphs 35 to 45, wherein the whiskers have a mean specific surface area less than 3.5 m$^2$/g.
47. The composition of paragraphs 35 to 45, wherein the whiskers have a mean specific surface area from about 2.283 m$^2$/g to about 2.304 m$^2$/g.
48. The composition of paragraphs 35 to 47, wherein the whiskers have a crystal growth rate of at least 3 times that of beta-derived calcium sulfate whiskers.
49. A method of making anhydrite calcium sulfate whiskers, comprising:
    combining calcium sulfate hemihydrate and water to form a slurry;
    autoclaving the slurry to form calcium sulfate hemihydrate whiskers in water;
    dewatering the calcium sulfate hemihydrate whiskers; and
    heating the calcium sulfate hemihydrate whiskers to form stable anhydrite calcium sulfate whiskers having a mean aspect ratio of at least 30.
50. The method of paragraph 49, wherein the anhydrite calcium sulfate whiskers have a mean aspect ratio from 30 to about 140.
51. The method of paragraph 49, wherein the anhydrite calcium sulfate whiskers have a mean aspect ratio from about 40 to about 115.
52. The method of paragraphs 49 to 51, wherein the anhydrite calcium sulfate whiskers have a mean diameter from about 0.3 μm to about 1.5 μm.
53. The method of paragraphs 49 to 51, wherein the anhydrite calcium sulfate whiskers have a mean diameter from about 0.4 μm to about 1.4 μm.
54. The method of paragraphs 49 to 53, wherein the anhydrite calcium sulfate whiskers have a mean length from about 20 μm to about 100 μm.
55. The method of paragraphs 49 to 53, wherein the anhydrite calcium sulfate whiskers have a mean length from about 40 μm to about 80 μm.
56. The method of paragraph 49, wherein the anhydrite calcium sulfate whiskers formed in the heating step have a mean length from about 60 μm to about 75 μm, a mean diameter from about 1.0 μm to about 1.5 μm, and a mean aspect ratio from about 40 to about 75.
57. The method of paragraphs 49 to 56, wherein the anhydrite calcium sulfate whiskers have a Mohs hardness from about 3 to about 3.5.
58. The method of paragraphs 49 to 57, wherein the anhydrite calcium sulfate whiskers are thermally stable up to at least 1400° C.
59. The method of paragraphs 49 to 58, wherein the anhydrite calcium sulfate whiskers have a mean true density of greater than 2.91 g/cm$^3$.
60. The method of paragraphs 49 to 58, wherein the anhydrite calcium sulfate whiskers have a mean true density from about 2.913 g/cm$^3$ to about 2.918 g/cm$^3$.
61. The method of paragraphs 49 to 60, wherein the anhydrite calcium sulfate whiskers have a mean specific surface area less than 3.5 m$^2$/g.
62. The method of paragraphs 49 to 60, wherein the anhydrite calcium sulfate whiskers have a mean specific surface area from about 2.283 m$^2$/g to about 2.304 m$^2$/g.
63. The method of paragraphs 49 to 62, wherein the calcium sulfate hemihydrate is alpha calcium sulfate hemihydrate.
64. The method of paragraph 63, wherein the alpha calcium sulfate whiskers have a crystal growth rate of at least 3 times that of beta calcium sulfate whiskers.
65. The method of paragraphs 49 to 64, wherein the calcium sulfate hemihydrate has a median particle size from about 1 μm to about 20 μm.
66. The method of paragraphs 49 to 64, wherein the calcium sulfate hemihydrate has a median particle size from about 1 μm to about 10 μm.
67. The method of paragraphs 49 to 64, wherein the calcium sulfate hemihydrate has a median particle size from about 1 μm to about 5 μm.
68. The method of paragraph 67, wherein the anhydrite calcium sulfate whiskers have a mean aspect ratio of at least 50.
69. The method of paragraph 67, wherein the anhydrite calcium sulfate have a mean aspect ratio mean aspect ratio from about 55 to about 140.
70. The method of paragraphs 67 to 69, wherein the anhydrite calcium sulfate whiskers have a mean diameter from about 0.4 μm to about 1.0 μm.
71. The method of paragraphs 67 to 69, wherein the anhydrite calcium sulfate whiskers have a mean diameter from about 0.4 μm to about 0.8 μm.
72. The method of paragraphs 67 to 71, wherein the anhydrite calcium sulfate whiskers have a mean length from about 40 μm to about 80 μm.
73. The method of paragraphs 67 to 71, wherein the anhydrite calcium sulfate whiskers have a mean length from about 45 μm to about 55 μm.
74. The method of paragraph 67, wherein the anhydrite calcium sulfate whiskers formed in the heating step have a mean length from about 45 μm to about 55 μm, a mean diameter from about 0.4 μm to about 0.8 μm, and a mean aspect ratio from about 55 to about 140.

While the disclosure has been described with reference to a number of embodiments, it will be understood by those skilled in the art that the disclosure is not limited to such disclosed embodiments. Rather, the disclosed embodiments can be modified to incorporate any number of variations, alterations, substitutions, or equivalent arrangements not described herein, but which are commensurate with the spirit and scope of the disclosure. Additionally, while various features of the invention have been described, it is to be understood that aspects of the invention may include only some of the described features. Moreover, while features of the embodiments have been discussed separately, it should be understood that any of the features disclosed herein may be combined in compositions and methods for making the same, with or without any other of the features or combinations of features. Accordingly, the invention is not to be seen as limited by the foregoing description, but is only limited by the scope of the appended claims.

What is claimed is:

1. A composition of matter, comprising anhydrite form calcium sulfate whiskers derived from alpha calcium sulfate hemihydrate particles,
   wherein the anhydrite form calcium sulfate whiskers have been formed through a method comprising:
   subjecting dihydrate calcium sulfate to a pressurized calcination process to produce particulate alpha calcium sulfate hemihydrate;
   sizing the alpha calcium sulfate hemihydrate to have a median particle size of from about 1 μm to about 5 μm;
   combining water and the particulate alpha calcium sulfate hemihydrate to form a slurry;
   autoclaving the slurry to form alpha calcium sulfate hemihydrate whiskers in water;
   dewatering the alpha calcium sulfate hemihydrate whiskers; and
   heating the alpha calcium sulfate hemihydrate whiskers to form the anhydrite form calcium sulfate whiskers.

2. The composition of claim 1, wherein the anhydrite form calcium sulfate whiskers have a mean aspect ratio from about 30 to about 140.

3. The composition of claim 1, wherein the anhydrite form calcium sulfate whiskers have a mean diameter from about 0.3 μm to about 1.5 μm.

4. The composition of claim 1, wherein the anhydrite form calcium sulfate whiskers have a mean length from about 20 μm to about 100 μm.

5. The composition of claim 1, wherein the anhydrite form calcium sulfate whiskers have a mean length from about 60 μm to about 75 μm, a mean diameter from about 1.0 μm to about 1.5 μm, and a mean aspect ratio from about 40 to about 75.

6. The composition of claim 1, wherein the anhydrite form calcium sulfate whiskers comprise fine alpha particle-derived anhydrite calcium sulfate whiskers.

7. The composition of claim 6, wherein the anhydrite form calcium sulfate whiskers have a mean length from about 45 μm to about 55 μm, a mean diameter from about 0.4 μm to about 0.8 μm, and a mean aspect ratio from about 55 to about 140.

8. The composition of claim 1, wherein the anhydrite form calcium sulfate whiskers have a Mohs hardness from about 3 to about 3.5.

9. The composition of claim 1, wherein the anhydrite form calcium sulfate whiskers are thermally stable up to at least 1400° C.

10. The composition of claim 1, wherein the anhydrite form calcium sulfate whiskers have a mean true density of greater than 2.91 g/cm$^3$.

11. The composition of claim 1, wherein the anhydrite form calcium sulfate whiskers have a mean true density from about 2.913 g/cm$^3$ to about 2.918 g/cm$^3$.

12. The composition of claim 1, wherein the anhydrite form calcium sulfate whiskers have a mean specific surface area from about 2.283 m$^2$/g to about 2.304 m$^2$/g.

13. A composition of matter, comprising insoluble anhydrite form calcium sulfate whiskers derived from alpha calcium sulfate hemihydrate particles, the insoluble anhydrite form calcium sulfate whiskers having a mean aspect ratio of at least 30,
   wherein the insoluble anhydrite form calcium sulfate whiskers have been formed through a method comprising:
   subjecting dihydrate calcium sulfate to a pressurized calcination process to produce particulate alpha calcium sulfate hemihydrate;
   sizing the alpha calcium sulfate hemihydrate to have a median particle size of from about 1 pm to about 5 pm:
   combining water and the particulate alpha calcium sulfate hemihydrate to form a slurry;
   autoclaving the slurry to form alpha calcium sulfate hemihydrate whiskers in water;
   dewatering the alpha calcium sulfate hemihydrate whiskers;
   heating the alpha calcium sulfate hemihydrate whiskers to form the insoluble anhydrite form calcium sulfate whiskers.

14. The composition of claim 13, wherein the insoluble anhydrite form calcium sulfate whiskers have a mean diameter from about 0.3 μm to about 1.5 μm.

15. The composition of claim 13, wherein the insoluble anhydrite form calcium sulfate whiskers have a mean length from about 20 μm to about 100 μm.

16. The composition of claim 13, wherein the insoluble anhydrite form calcium sulfate whiskers have a mean length from about 60 μm to about 75 μm, a mean diameter from about 1.0 μm to about 1.5 μm, and a mean aspect ratio from about 40 to about 75.

17. The composition of claim 13, wherein the insoluble anhydrite form calcium sulfate whiskers have a Mohs hardness from about 3 to about 3.5.

18. The composition of claim 13, wherein the insoluble anhydrite form calcium sulfate whiskers are thermally stable up to at least 1400° C.

19. The composition of claim 13, wherein the insoluble anhydrite form calcium sulfate whiskers have a mean true density from about 2.913 g/cm$^3$ to about 2.918 g/cm$^3$.

20. The composition of claim 13, wherein the insoluble anhydrite form calcium sulfate whiskers have a mean specific surface area from about 2.283 m$^2$/g to about 2.304 m$^2$/g.

21. The composition of claim 13, wherein the particulate alpha calcium sulfate hemihydrate has a median particle size of from about 2 μm to about 5 μm.

22. The composition of claim 13, wherein the heating the alpha calcium sulfate hemihydrate whiskers to form the insoluble anhydrite form calcium sulfate whiskers is at a temperature from about 500° C. to about 900° C. for a duration from about 20 minutes to about 24 hours.

23. The composition of claim 1, wherein the sized alpha calcium sulfate hemihydrate has a median particle size of from about 2 μm to about 5 μm.

24. The composition of claim 1, wherein the heating the alpha calcium sulfate hemihydrate whiskers to form the anhydrite form calcium sulfate whiskers is at a temperature from about 500° C. to about 900° C. for a duration from about 20 minutes to about 24 hours.

* * * * *